(12) United States Patent
Ryu et al.

(10) Patent No.: US 8,569,951 B2
(45) Date of Patent: Oct. 29, 2013

(54) ORGANIC LIGHT-EMITTING DISPLAY APPARATUS AND METHOD OF MANUFACTURING THE SAME

(75) Inventors: Ji-Hun Ryu, Yongin (KR); Dong-Won Han, Yongin (KR); Young-Seo Choi, Yongin (KR); Jae-Ho Lee, Yongin (KR); Oh-June Kwon, Yongin (KR); Jin-Ho Kwack, Yongin (KR); Dae-Beom Shin, Yongin (KR); Dong-Hun Kang, Yongin (KR); Hyo-Jin Kim, Yongin (KR); Seung-Yong Song, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 60 days.

(21) Appl. No.: 13/243,614

(22) Filed: Sep. 23, 2011

(65) Prior Publication Data

US 2012/0146492 A1 Jun. 14, 2012

(30) Foreign Application Priority Data

Dec. 10, 2010 (KR) .................. 10-2010-0126358

(51) Int. Cl.
*H01J 1/63* (2006.01)
(52) U.S. Cl.
USPC ............... 313/512; 445/24; 445/25; 313/504; 313/505; 428/690
(58) Field of Classification Search
USPC ............... 313/504–512; 445/24, 25; 428/690
See application file for complete search history.

(56) References Cited

U.S. PATENT DOCUMENTS

| 7,612,498 | B2 * | 11/2009 | Sano et al. ............. 313/506 |
| 7,741,769 | B2 | 6/2010 | Hayashi |
| 7,804,240 | B2 | 9/2010 | Shim et al. |
| 2003/0085654 | A1 * | 5/2003 | Hayashi ............. 313/506 |
| 2004/0232832 | A1 * | 11/2004 | Kubota ............. 313/512 |
| 2005/0156513 | A1 | 7/2005 | Sano et al. |
| 2008/0180022 | A1 | 7/2008 | Kwack et al. |
| 2008/0238301 | A1 * | 10/2008 | Shim et al. ............. 313/504 |
| 2009/0267487 | A1 | 10/2009 | Kwack et al. |

FOREIGN PATENT DOCUMENTS

| JP | 2003-017244 A | 1/2003 |
| KR | 1020050051570 | 6/2005 |
| KR | 1020060060247 A | 6/2006 |
| KR | 10-2007-0054106 A | 5/2007 |
| KR | 100796129 B | 1/2008 |
| KR | 10-2008-0088991 A | 10/2008 |
| KR | 1020090112387 | 10/2009 |

OTHER PUBLICATIONS

Korean Office Action issued May 16, 2012 in connection with Korean Patent Application Serial No. 10-2010-0126358 and Request for Entry of the Accompanying Office Action attached herewith.

* cited by examiner

*Primary Examiner* — Nimeshkumar Patel
*Assistant Examiner* — Jacob R Stern
(74) *Attorney, Agent, or Firm* — Robert E. Bushnell, Esq.

(57) ABSTRACT

In an organic light-emitting display apparatus and a method of manufacturing the same, the organic light-emitting display apparatus comprises: a substrate; a light-emitting unit formed on the substrate; and an encapsulation film, which covers the light-emitting unit on the substrate, and which includes a plurality of organic layers and a plurality of inorganic layers which are alternately stacked.

17 Claims, 7 Drawing Sheets

ORGANIC LIGHT-EMITTING DISPLAY APPARATUS AND METHOD OF MANUFACTURING THE SAME

CLAIM OF PRIORITY

This application makes reference to, incorporates the same herein, and claims all benefits accruing under 35 U.S.C. §119 from an application for ORGANIC LIGHT-EMITTING DISPLAY APPARATUS AND METHOD OF MANUFACTURING THE SAME earlier filed in the Korean Intellectual Priority Office on 10 Dec. 2010 and there duly assigned Serial No. 10-2010-0126358.

BACKGROUND OF THE INVENTION

1. Field of the Invention

The present invention relates to an organic light-emitting display apparatus and a method of manufacturing the same. More particularly, the invention relates to an organic light-emitting display apparatus with reduced defect rates due to particles, and having a film encapsulation structure with improved resistance to moisture.

2. Description of the Related Art

An organic light-emitting device is a self-luminescent device that may be applied to various products, such as thin and flexible display apparatuses. However, device properties of such an organic light-emitting device drastically deteriorate when the device is exposed to moisture and oxygen from the external environment.

Therefore, after an organic light-emitting device is fabricated, the organic light-emitting device is encapsulated by using a can or a glass substrate, wherein a polymer material, such as UV ray-hardening epoxy, thermal hardening epoxy, or acryl, is generally used as sealant material. However, since a polymer material is weak against moisture, properties of an organic light-emitting device, such as brightness, deteriorate due to moisture and oxygen permeating into the organic light-emitting device over time, and thus the lifespan of the organic light-emitting device is reduced. To prevent the deterioration, a moisture absorbent member, which absorbs moisture, is installed in a display apparatus to prevent moisture transmitted through a sealant from affecting the organic light-emitting device. However, this technique makes the manufacturing process complicated overall, and increases the weight and volume of a fabricated display apparatus.

To resolve this problem, a film encapsulation method for encapsulating a display device by covering the display device with a protective film has been introduced. A film encapsulation material used in the film encapsulation method is a material directly related to the lifespan of a manufactured organic light-emitting device, and thus it is necessary to appropriately adjust conditions, including moisture permeability, adhesiveness with respect to a device material, and a thermal expansion coefficient. In particular, the moisture permeability is the most important factor which significantly affects the lifespan of an organic light-emitting device. Moisture permeation through a film encapsulation material includes vertical permeation with respect to a surface of a film and lateral permeation through a section of a display apparatus, that is, a non-luminescent area.

Although a conventional film encapsulation method effectively prevents permeation of moisture or oxygen in a direction perpendicular to a substrate, moisture and oxygen may permeate along interfaces of an encapsulation layer from ends of a film in a direction parallel to the substrate.

SUMMARY OF THE INVENTION

The present invention provides an organic light-emitting display apparatus with reduced defect rates due to particles, and having a film encapsulation structure with improved resistance to moisture.

According to an aspect of the present invention, there is provided an organic light-emitting display apparatus comprising: a substrate; a light-emitting unit formed on the substrate; and an encapsulation film, which covers the light-emitting unit on the substrate, and which includes a plurality of organic layers and a plurality of inorganic layers which are alternately stacked; wherein at least one of the plurality of organic layers has a width different from those of the others.

Edges of the capsulation film may have a structure in which the plurality of inorganic layers are stacked.

Widths of the plurality of organic layers may decrease in the order stacked on the substrate.

The plurality of inorganic layers may be formed so as to have a width greater than those of the plurality of organic layers.

The width of the topmost organic layer, from among the plurality of organic layers may be identical to or greater than the width of the light-emitting unit.

The plurality of organic layers and the plurality of inorganic layers may contain transparent materials.

The encapsulation film may comprise: a first organic layer contacting the light-emitting unit; a first inorganic layer covering a portion of the substrate together with the first organic layer; a second organic layer which is formed on the first inorganic layer, and which has a width smaller than that of the first organic layer; and a second inorganic layer covering the second organic layer.

The second inorganic layer may be formed so as to have a width the same as that of the first inorganic layer.

The encapsulation film may further include a third organic layer which is formed on the second inorganic layer, and which has a width smaller than that of the second organic layer; and a third inorganic layer covering the third organic layer.

According to another aspect of the present invention, there is provided a method of manufacturing an organic light-emitting display apparatus, the method comprising the steps of: preparing a substrate; forming a light-emitting unit on the substrate; and forming an encapsulation film which covers the light-emitting unit on the substrate, and which includes a plurality of organic layers and a plurality of inorganic layers which are alternately stacked; wherein at least one of the plurality of organic layers has a width different from those of the others.

In the step of forming the encapsulation film, the plurality of organic layers may be formed by using a plurality of masks having openings of different sizes.

In the step of forming the encapsulation film, the plurality of organic layers may be formed by using the same mask.

The mask for forming the inorganic layers may includes openings larger than those of the masks for forming the organic layers.

In the step of forming the encapsulation film, a step of forming an organic layer on the light-emitting unit and a step of forming an inorganic layer on the organic layer are performed for a plurality of times, and widths of the organic layers may decrease in the order stacked.

The plurality of inorganic layers may be formed so as to have a width greater than those of the plurality of organic layers.

The width of the topmost organic layer, from among the plurality of organic layers, may be identical to or greater than the width of the light-emitting unit.

The step of forming the encapsulation film may comprise: forming a first organic layer on the light-emitting unit by using a first mask for forming the first organic layer having a first opening; forming a first inorganic layer on the first organic layer by using a first mask for forming the first inorganic layer; forming a second organic layer on the first inorganic layer by using a second mask for forming the second organic layer, the second mask having a second opening smaller than the first opening; and forming a second inorganic layer on the second organic layer by using a second mask for forming the second inorganic layer.

The size of the first opening of the first mask for forming the first organic layer may be larger than that of the light-emitting unit.

The first mask for forming the first inorganic layer may include an opening larger than the first opening.

The first mask for forming the first inorganic layer and the second mask for forming the second inorganic layer may be identical to each other.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Hereinafter, the present invention will be described in detail by explaining preferred embodiments of the invention with reference to the attached drawings.

Figure 1:
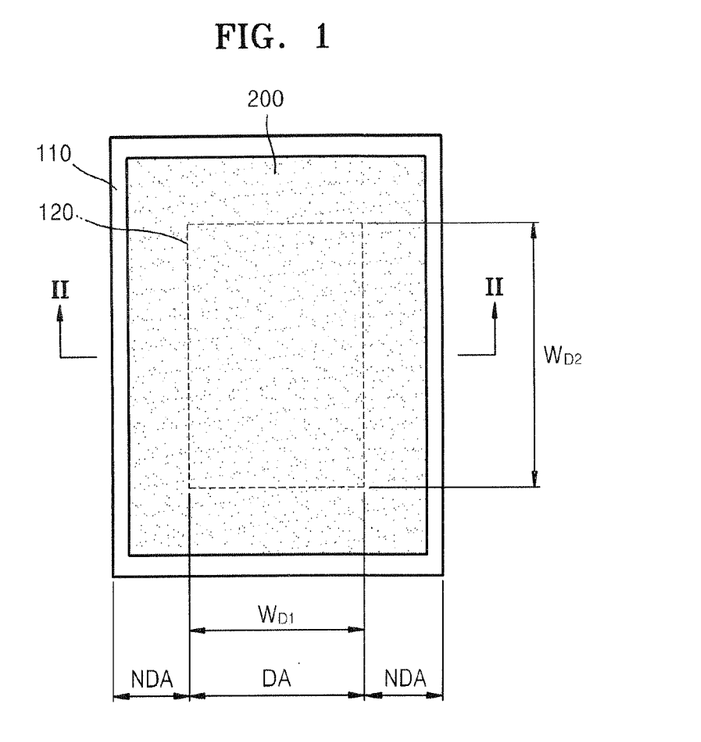
FIG. 1 is a plan view schematically showing an organic light-emitting display apparatus according to an embodiment of the present invention.
Figure 2:
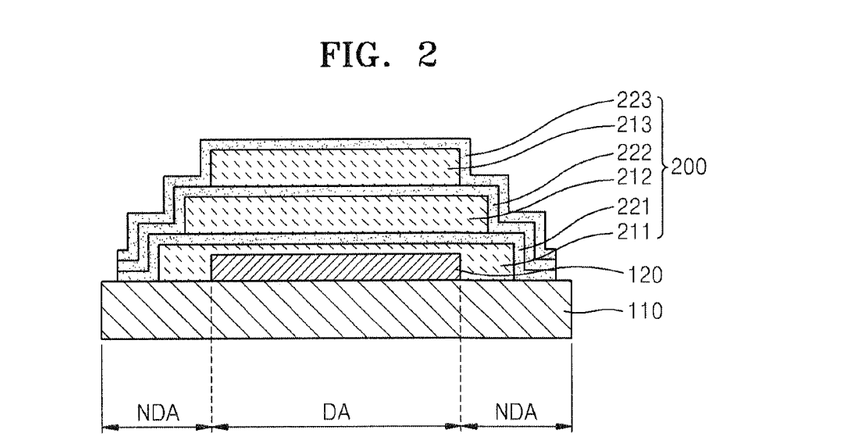
FIG. 2 is a lateral sectional view taken along a line II-II of FIG. 1.
Figure 3:
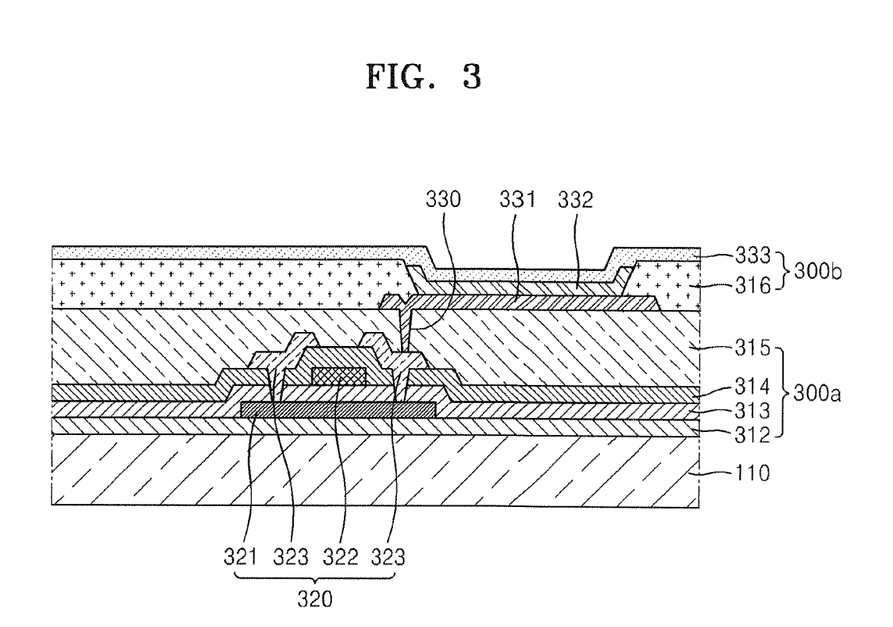
FIG. 3 is a lateral sectional view showing a light-emitting unit of FIG. 1 in more detail.

FIG. 1 is a plan view schematically showing an organic light-emitting display apparatus according to an embodiment of the present invention; FIG. 2 is a lateral sectional view taken along a line II-II of FIG. 1; and FIG. 3 is a lateral sectional view showing a light-emitting unit of FIG. 1 in closer detail.

Referring to FIGS. 1 and 2, the organic light-emitting display apparatus includes a substrate 110 having a light-emitting unit 120 and an encapsulation film 200 formed on the substrate 110.

The substrate 110 may be a $SiO_2$-based transparent glass substrate. Alternatively, any of various types of substrates, including metal substrates and plastic substrates, may be used.

The light-emitting unit 120 is formed on the substrate 110, and may be substantially rectangular. For example, the shape of the light-emitting unit 120 may be a square, a first width WD1 of which and a second width WD2 of which are identical to each other, or a rectangle, a first width WD1 of which and a second width WD2 of which are different from each other.

Referring to FIG. 3, the light-emitting unit 120 includes a thin-film transistor (TFT) layer 300a and a pixel unit 300b.

An insulation layer 312, such as a barrier layer and/or a buffer layer for preventing diffusion of impurity ions, for preventing permeation of moisture or oxygen and for planarizing the top surface of the substrate 110, may be formed on a top surface of the substrate 110.

A TFT 320 is formed on the insulation layer 312 as a driving circuit. Although the present embodiment provides a top gate type TFT as an example of the TFT 320, another type of TFTs may also be formed.

An active layer 321 of the TFT 320 is formed on the insulation layer 312 using a semiconductor material, and a gate insulation layer 313 is formed so as to cover the active layer 321. The active layer 321 may be formed of an inorganic semiconductor, such as amorphous silicon or polysilicon, or an organic semiconductor, and may include a source region, a drain region, and a channel region between the source region and the drain region.

A gate electrode 322 is disposed on the gate insulation layer 313, and an interlayer insulation layer 314 is formed so as to cover the gate electrode 322. Furthermore, source and drain electrodes 323 are formed on the interlayer insulation layer 314, and a planarization layer 315 is formed so as to cover the source and drain electrodes 323.

However, the present invention is not limited to the TFT stack structure described above, and any TFTs having various structures may be applied.

A first electrode 331, which is an electrode of an organic light-emitting device, is formed on the top surface of the planarization layer 315, and is electrically connected to one of the source and drain electrodes 323 via a contact hole 330.

A second electrode 333 is arranged above the first electrode 331 so as to face the first electrode 331.

The first electrode 331 functions as an anode electrode, whereas the second electrode 333 functions as a cathode electrode. However, the polarities of the first electrode 331 and the second electrode 333 may be exchanged.

The first electrode 331 may be formed as a transparent electrode or a reflective electrode. If the first electrode 331 is formed as a transparent electrode, the first electrode 331 may be formed of ITO, IZO, ZnO, or $In_2O_3$. Otherwise, if the first electrode 331 is formed as a reflective electrode, the first electrode 331 may include a reflective layer formed of Ag, Mg, Al, Pt, Pd, Au, Ni, Nd, Ir, Cr, or a compound thereof, and a transparent layer formed of ITO, IZO, ZnO, or $In_2O_3$. The second electrode 333 may also be formed as a transparent electrode or a reflective electrode. If the second electrode 333 is formed as a transparent electrode, the second electrode 333 may include a layer formed by depositing Li, Ca, LiF/Ca, LiF/Al, Al, Mg, or a compound thereof, on an intermediate layer and a counter electrode or a bus electrode line formed of a transparent conductive material, such as ITO, IZO, ZnO, or $In_2O_3$. Otherwise, if the second electrode 333 is formed as a reflective electrode, the second electrode 333 may be formed of Li, Ca, LiF/Ca, LiF/Al, Al, Mg, or a compound thereof.

Also, if the substrate 110 includes a TFT as described above, the first electrode 331 patterned for each sub-pixel is electrically connected to TFTs of each of the sub-pixels. Here, the second electrode 333 may be formed as a common electrode connected across all of the sub-pixels. If the substrate 110 includes no TFTs in each sub-pixel, the first electrode 331 and the second electrode 333 may be patterned into shapes of stripes crossing each other, and may be passive matrix driven.

An organic film layer 332 is interposed between the first electrode 331 and the second electrode 333.

The organic film layer 332 may be formed of a monomer or polymer organic material. In the case of using a monomer organic material to form the organic film layer 332, the organic film layer 332 may be formed by stacking a hole injection layer (HIL), a hole transport layer (HTL), an organic emission layer (EML), an electron transport layer (ETL), and an electron injection layer (EIL) in a single or multi-layer structure, and various organic raw materials, which include copper phthalocyanine (CuPc), N,N-di(naphthalene-1-yl)-N, N'-diphenyl-benzidine (NPB), and tris-8-hydroxyquinoline aluminum (Alq3), may be used. The monomer organic materials may be formed by using a method such as vacuum deposition using masks. A polymer organic material may generally have a structure including a HTL and an EML. Here, the HTL is formed of poly(3,4-ethylenedioxythiophene) (PEDOT), whereas the EML is formed of a polymer organic material, such as a polyphenylene vinylene (PPV)-based material, and a polyfluorene-based material.

Referring to FIG. 2, the encapsulation film 200 covers the light-emitting unit 120 (a luminescent area DA) and a portion of a non-luminescent area NDA around the light-emitting unit 120. The encapsulation film 200 may be formed by applying a liquid material. Alternatively, the encapsulation film 200 may be formed by using any method including sputtering, thermal evaporation, chemical vapor deposition (CVD), plasma-enhanced CVD, ion beam-assisted deposition (IBAD), atomic layer deposition (ALD), etc.

The encapsulation film 200 prevents the light-emitting unit 120 from being deteriorated by moisture or oxygen from outside. The encapsulation film 200 includes inorganic layers 221, 222, and 223 and organic layers 211, 212, and 213 which are formed alternately. The inorganic layers 221, 222, and 223 are formed to block permeation of moisture or oxygen from outside, whereas the organic layers 211, 212, and 213 improve the effect of blocking permeation of moisture or oxygen from outside by filling fine cracks or pinholes of the inorganic layers 221, 222, and 223 and reducing internal stress of the inorganic layers 221, 222, and 223.

The organic layers 211, 212, and 213 are vertically stacked, and at least one of the organic layers 211, 212, and 213 is formed so as to have a width different from those of the others. Referring to FIG. 2, widths of the first organic layer 211, the second organic layer 212, and the third organic layer 213 decrease in the order stated. Therefore, the overall thickness of portions of the organic layers 211, 212, and 213 arranged above the light-emitting unit 120 is relatively large, and thus defect rates due to particles and defects may be reduced. Furthermore, the thickness of portion of the organic layer 211 arranged at a side of the light-emitting unit 120 is relatively small, and thus dead area may be reduced.

Although at least one of the organic layers 211, 212, and 213 is formed so as to have a different width, the inorganic layers 221, 222, and 223 are formed so as to have the same width, and thus only the inorganic layers 221, 222, and 223 are stacked at edges of the encapsulation layer 200. The inorganic layers 221, 222, and 223 block permeation of moisture or oxygen from outside, and thus the light-emitting unit 120 according to the present invention is effectively protected.

Although the three organic layers 211, 212, and 213 and the three inorganic layers 221, 222, and 223 are formed in the present embodiment, the present invention is not limited thereto. For example, the number of the inorganic layers 221, 222, and 223 and the number of the organic layers 211, 212, and 213 may be one, two, or four or more.

Hereinafter, a method of manufacturing an organic light-emitting display apparatus according to the present invention will be described.

Figure 4:
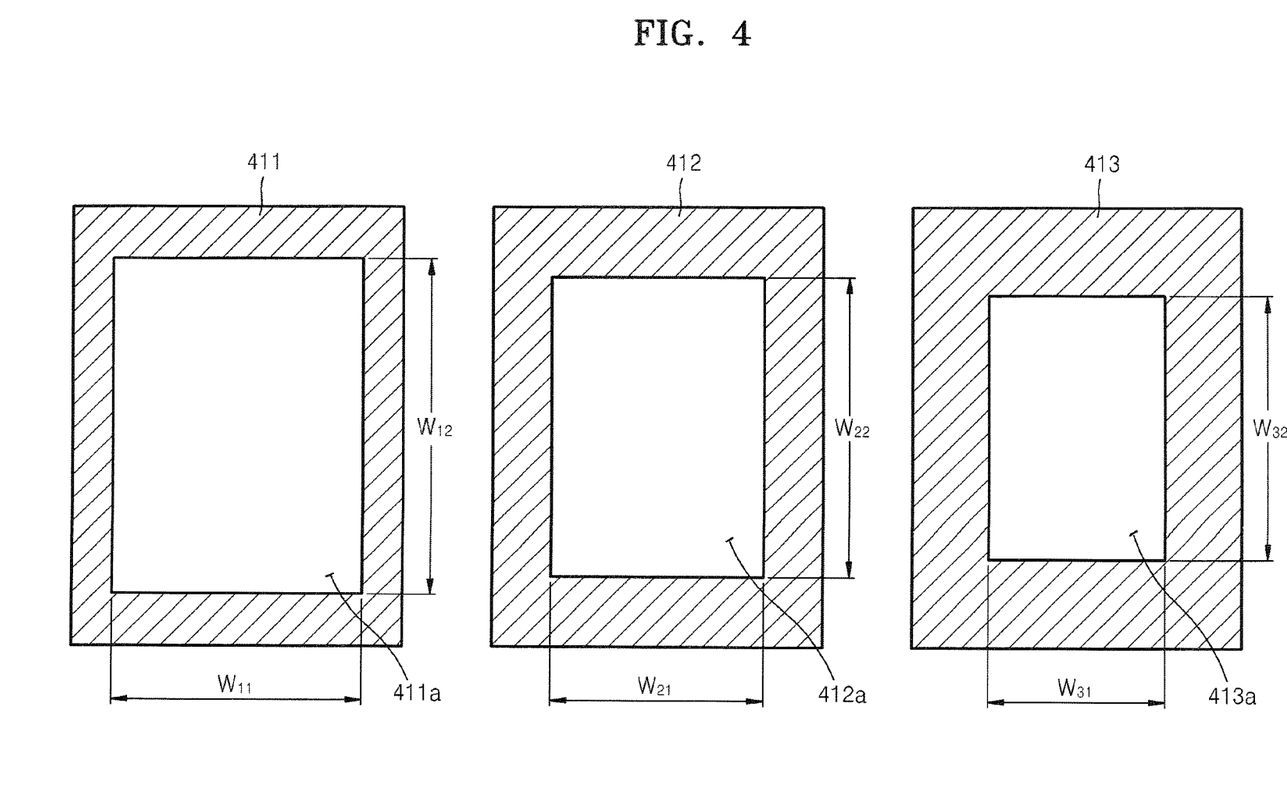
FIG. 4 is a plan view showing masks which are used for forming organic layers according to an embodiment of the present invention.
Figure 5:
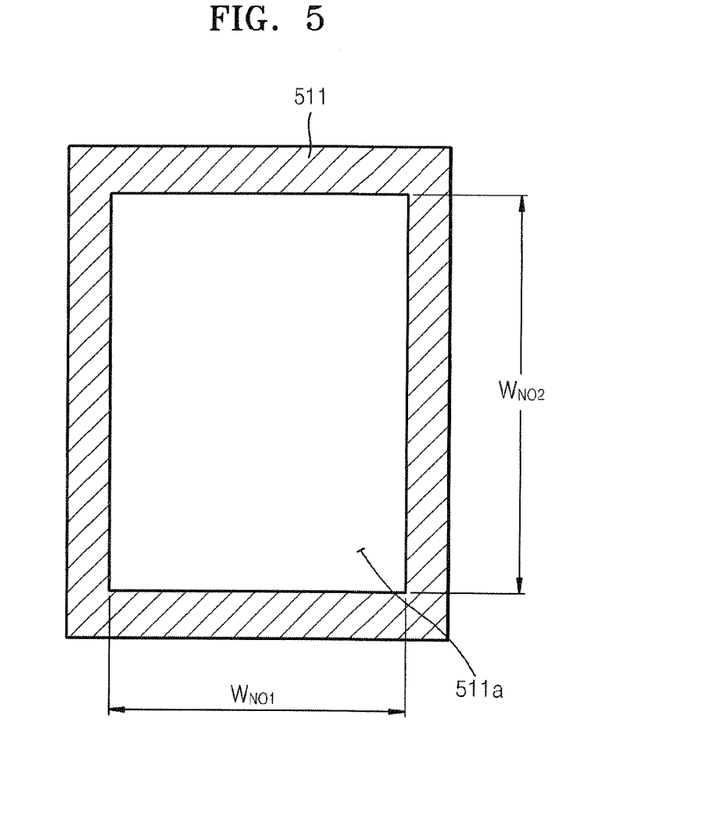
FIG. 5 is a plan view showing a mask which is used for forming inorganic layers according to an embodiment of the present invention.

FIG. 4 is a plan view showing masks which are used for forming organic layers according to an embodiment of the present invention; and FIG. 5 is a plan view showing a mask which is used for forming inorganic layers according to an embodiment of the present invention.

Referring to FIG. 4, the first mask 411 is used to form the first organic layer 211 of FIG. 2, and has a first opening 411a larger than the light-emitting unit 120. If the light-emitting unit 120 is rectangular, the first opening is also formed to be rectangular, and a first width W11 and a second width W12 of the first opening 411a are larger than the widths WD1 and WD2 of the light-emitting unit 120.

The second mask 412 is used to form the second organic layer 212, and has a second opening 412a smaller than the first opening 411a. In other words, a first width W21 and a second width W22 of the second opening 412a are smaller than the first width W11 and the second width W12 of the first opening 411a.

The third mask 413 is used to form the third organic layer 213 and has a third opening 413a smaller than the second opening 412a. In other words, a first width W31 and a second width W32 of the third opening 413a are smaller than the first width W21 and the second width W22 of the second opening 412a.

Also, if the organic light-emitting display apparatus is the top-emission type, the first width W31 of the third opening 413a is formed so as to be same as or larger than the first width WD1 of the light-emitting unit 120, and the second width W32 of the third opening 413a is formed so as to be the same as, or larger than, the second width WD2 of the light-emitting unit 120. For example, if the widths of the third organic layer 213 are smaller than the widths of the light-emitting unit 120, light emitted by the light-emitting unit 120 is transmitted in different paths in a portion of the luminescent area DA including the third organic layer 213 and a portion of the luminescent area DA not including the third organic layer 213. Therefore, light emitted by the light-emitting unit 120 may be distorted. To prevent the distortion, the size of the third opening 413 is the same as, or larger than, the light-emitting unit 120.

Referring to FIG. 5, a fourth mask 511 for forming the inorganic layers 221, 222, and 223 of FIG. 2 has a fourth opening 511a which is larger than the light-emitting unit 120 and the first organic layer 211. A first width WN01 and a second width WN02 of the fourth opening 511a are larger than the widths W11 and W12 of the first opening 411a.

FIGS. 6 thru 11 are lateral sectional views showing operations for manufacturing an organic light-emitting display apparatus according to an embodiment of the present invention. In the present embodiment, the encapsulation film 200 is formed by using the first thru third masks 411, 412, and 413, respectively, and the fourth mask 511 described above with reference to FIGS. 4 and 5. In the present embodiment, the light-emitting unit 120 is rectangular, and the present embodiment will be described below with reference to lateral sectional views with respect to a first width. However, descriptions below are identically applied to a second width.

Figure 6:
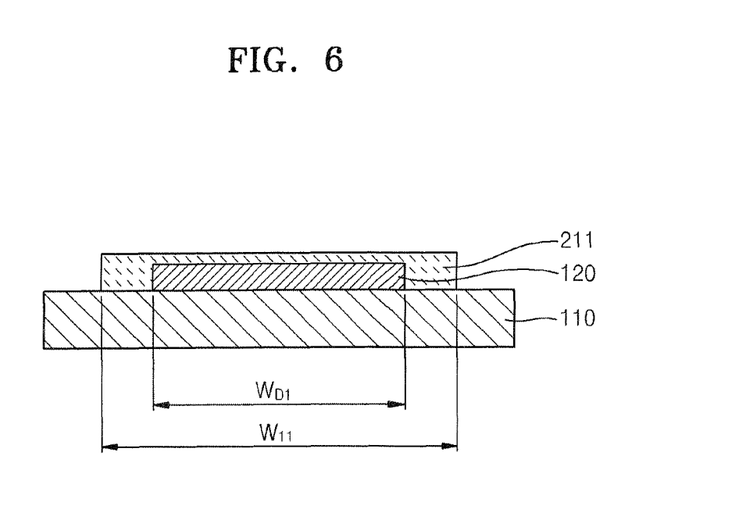
FIGS. 6 thru 11 are lateral sectional views showing operations for manufacturing an organic light-emitting display apparatus according to an embodiment of the present invention.

Referring to FIG. 6, the first organic layer 211 is formed on the substrate 110, on which the light-emitting unit 120 is formed, by using the first mask 411 of FIG. 4. The first organic layer 211 is formed to directly contact the light-emitting unit 120, and to cover the light-emitting unit 120. In other words, due to the first opening 411a of the first mask 411, the first width W11 of the first organic layer 211 is larger than the first width WD1 of the light-emitting unit 120.

The first organic layer may be formed of a polymer, such as parylene(poly-p-xylylene) (PPX), poly-2-chloro-p-zylylene (PCPX), poly[2-methoxy-r-(2'ethyhexylloxy-1,4-phenylene vinylene), polyurea, polyamic acid, or the like. However, the present invention is not limited thereto. Also, as described above, the first organic layer 211 may be formed either by applying a liquid material or by using any of several methods including sputtering, thermal evaporation, chemical vapor deposition (CVD), plasma-enhanced CVD, ion beam-assisted deposition (IBAD), atomic layer deposition (ALD), etc.

Figure 7:
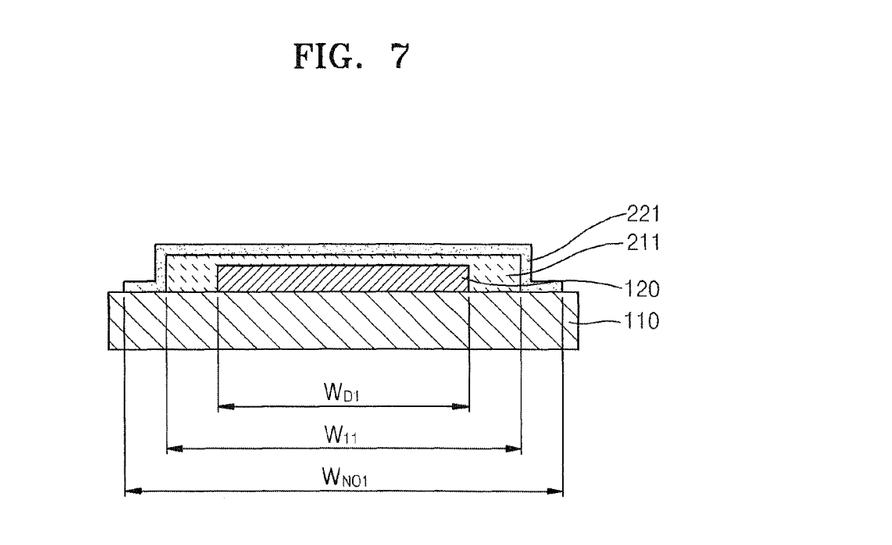

Referring to FIG. 7, the first inorganic layer 221 is formed by using the fourth mask 511. Since the fourth opening 511a is larger than the first opening 411a, the first inorganic layer 221 covers the second organic layer 212 and contacts the substrate 110. The first inorganic layer 221 may contain $SiN_x$, $SiO_x$, $AlO_x$, $SiC_xN_y$, $SiO_xN_y$, amorphous carbon, $InO_x$, or $YbO_x$. However, the present invention is not limited thereto. The first inorganic layer 221 may be formed by using one of the methods described above as methods for forming the first organic layer 211.

Figure 8:
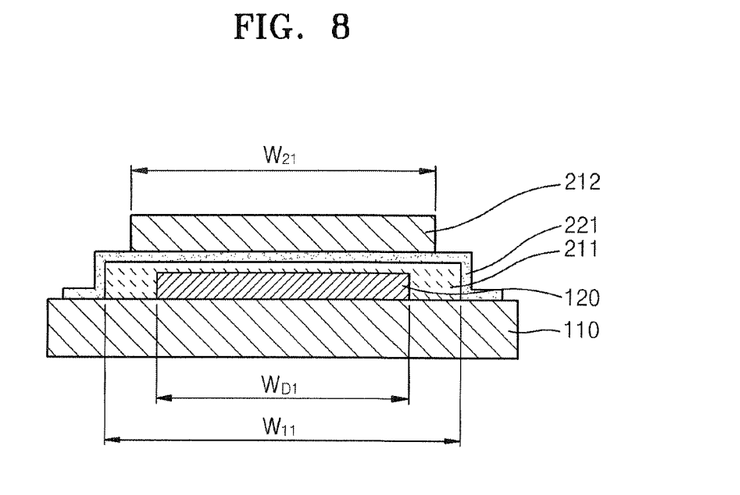

Referring to FIG. 8, the second organic layer 212 is formed on the first inorganic layer 221 by using the second mask 412. Since the second opening 412a is smaller than the first opening 411a, the first width W21 of the second organic layer 212 is smaller than the first width W11 of the first organic layer 211. The second organic layer 212 may be formed using the same material and method as the first organic layer 211.

Figure 9:
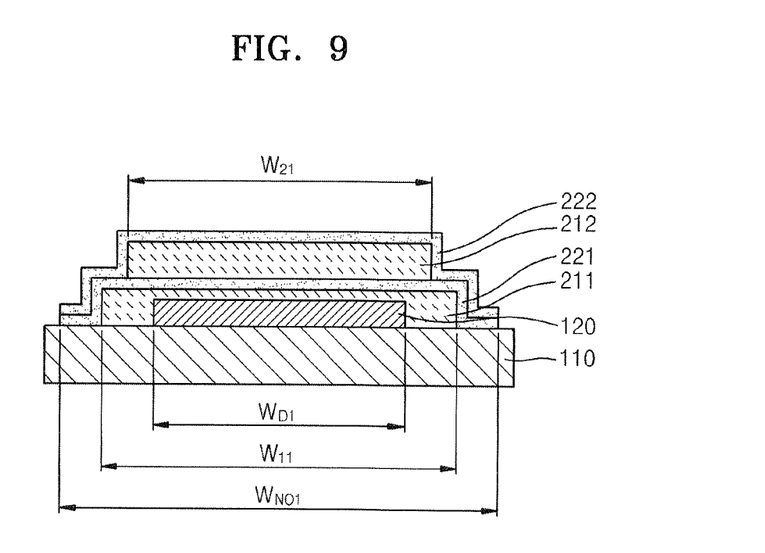

Referring to FIG. 9, the second inorganic layer 222 is formed on the second organic layer 212 by using the fourth mask 511 of FIG. 5. Here, since the second inorganic layer 222 is also formed by using the fourth mask 511 as in the first inorganic layer 221, the second inorganic layer 222 covers the second organic layer 212, and edges of the second inorganic layer 222 overlap edges of the first inorganic layer 221. The second inorganic layer 222 may be formed using same material and method as the first inorganic layer 221.

Figure 10:
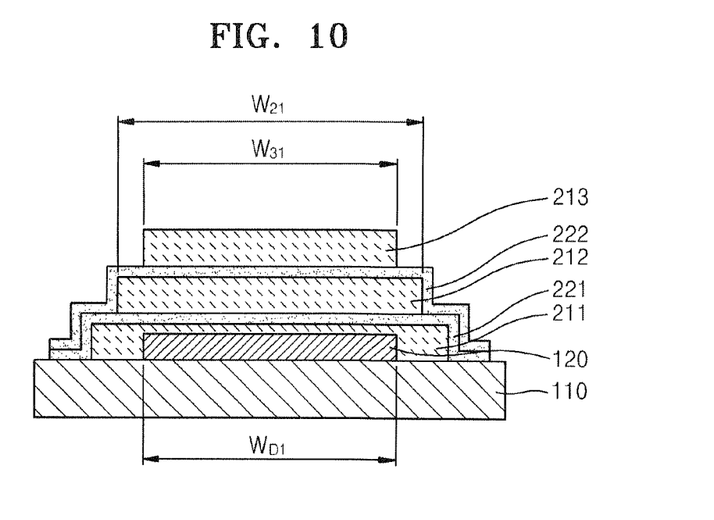

Referring to FIG. 10, the third organic layer 213 is formed on the second inorganic layer 222 by using the third mask 413. Since the third opening 413a is smaller than the second opening 412a, the first width W31 of the third organic layer 213 is smaller than the first width W21 of the second organic layer 212. The third organic layer 213 may be formed using same material and method as the first and second organic layers 211 and 212, respectively.

Figure 11:
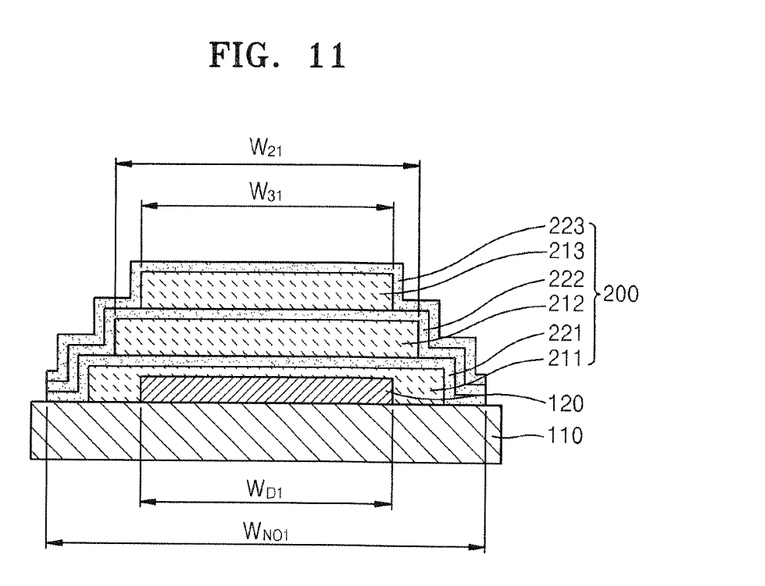

Referring to FIG. 11, the third inorganic layer 223 is formed on the third organic layer 213 by using the fourth mask 511. Here, since the third inorganic layer 223 is also formed by using the fourth mask 511, the third inorganic layer 223 covers the third organic layer 213, and edges of the third inorganic layer 223 overlap edges of the first and second inorganic layers 221 and 222, respectively. The third inorganic layer 223 may be formed using same material and method as the first and second inorganic layer 221 and 222, respectively.

As described above, if an organic light-emitting display apparatus according to the present invention is a top-emission type, the first width W31 of the third organic layer 213 is the same as or larger than the first width WD1 of the light-emitting unit 120. Furthermore, in this case, the inorganic layers 221, 222, and 223 and the organic layers 211, 212 and 213 are formed of materials with high transparencies.

On the contrary, if an organic light-emitting device display apparatus is a bottom-emission type, the first width W31 of the third organic layer 213 may be smaller than the first width WD1 of the light-emitting unit 120.

Although the plurality of inorganic layers 221, 222 and 223 which are formed by using the fourth mask 511 only, the present invention is not limited thereto. For example, as long as the organic layers 211, 212, and 213 are covered, and edges of the encapsulation film 200 are formed only by the inorganic layers 221, 222, and 223, numbers and types of masks are not limited.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. An organic light-emitting display apparatus, comprising:
    a substrate;
    a light-emitting unit formed on the substrate; and
    an encapsulation film which covers the light-emitting unit on the substrate, and which comprises a plurality of organic layers and a plurality of inorganic layers which are alternately stacked;
    wherein each of the plurality of organic layers has a width different from widths of the other organic layers, a smallest one, in width, of the organic layers having a same width as the light-emitting unit.

2. The organic light-emitting display apparatus of claim 1, wherein edges of the capsulation film have a structure in which the plurality of inorganic layers are stacked.

3. The organic light-emitting display apparatus of claim 1, wherein widths of the plurality of organic layers decreases in an order stacked on the substrate.

4. The organic light-emitting display apparatus of claim 1, wherein the plurality of inorganic layers are formed so as to have a width greater than widths of the plurality of organic layers.

5. The organic light-emitting display apparatus of claim 1, wherein the plurality of organic layers and the plurality of inorganic layers contain transparent materials.

6. The organic light-emitting display apparatus of claim 1, wherein the encapsulation film comprises:
    a first organic layer contacting the light-emitting unit;
    a first inorganic layer covering a portion of the substrate together with the first organic layer;
    a second organic layer which is formed on the first inorganic layer, and which has a width smaller than a width of the first organic layer; and
    a second inorganic layer covering the second organic layer.

7. The organic light-emitting display apparatus of claim 6, wherein the second inorganic layer is formed so as to have a same width as the first inorganic layer.

8. The organic light-emitting display apparatus of claim 6, wherein the encapsulation film further comprises:
    a third organic layer which is formed on the second inorganic layer, and which has a width smaller than the width of the second organic layer; and
    a third inorganic layer covering the third organic layer.

9. A method of manufacturing an organic light-emitting display apparatus, the method comprising the steps of:
- preparing a substrate;
- forming a light-emitting unit on the substrate; and
- forming an encapsulation film which covers the light-emitting unit on the substrate, and which comprises a plurality of organic layers and a plurality of inorganic layers which are alternately stacked;
- wherein each of the plurality of organic layers has a width different from widths of other organic layers, a smallest one of the organic layers, in width, having a same width as the light-emitting unit.

10. The method of claim 9, wherein, in the step of forming the encapsulation film, the plurality of organic layers are formed by using a plurality of masks having openings of different sizes.

11. The method of claim 9, wherein, in the step of forming the encapsulation film, the plurality of organic layers are formed by using a same mask.

12. The method of claim 10, wherein a mask for forming the inorganic layers comprises an opening larger than an opening of each of the masks for forming the organic layers.

13. The method of claim 9, wherein, in the step of forming the encapsulation film, a step of forming an organic layer on the light-emitting unit and a step of forming an inorganic layer on the organic layer are performed for a plurality of times, and widths of the organic layers decreases in the order stacked.

14. The method of claim 13, wherein the plurality of inorganic layers are formed so as to have a width greater than widths of the plurality of organic layers.

15. The method of claim 9, wherein the step of forming the encapsulation film comprises:
- forming a first organic layer on the light-emitting unit by using a first mask having a first opening;
- forming a first inorganic layer on the first organic layer by using a second mask;
- forming a second organic layer on the first inorganic layer by using a third mask having a second opening smaller than the first opening; and
- forming a second inorganic layer on the second organic layer by using the second mask.

16. The method of claim 15, wherein a size of the first opening is larger than a size of the light-emitting unit.

17. The method of claim 15, wherein the second mask comprises has an opening larger than the first opening.

* * * * *